United States Patent
Yawata et al.

[11] Patent Number: 5,892,302
[45] Date of Patent: Apr. 6, 1999

[54] POWER SWITCHING CIRCUIT

[75] Inventors: Hiroki Yawata; Hidemi Honma, both of Hyogo, Japan

[73] Assignees: Mitsubishi Electric Semiconductor Software Co. Ltd., Hyogo; Mitsubishi Denki Kabushiki Kaisha, Tokyo, both of Japan

[21] Appl. No.: 953,727

[22] Filed: Oct. 17, 1997

[30] Foreign Application Priority Data

Mar. 28, 1997 [JP] Japan ..................................... 9-078648

[51] Int. Cl.[6] .............................................. H03K 17/296
[52] U.S. Cl. ............................. 307/125; 326/62; 326/80; 327/333
[58] Field of Search ...................... 307/125, 151; 326/62, 80; 365/189.11; 327/333; 315/160, 172

[56] References Cited

U.S. PATENT DOCUMENTS

| | | | |
|---|---|---|---|
| 4,109,163 | 8/1978 | Cricchi et al. | 326/80 |
| 4,178,628 | 12/1979 | Shepard | 307/151 |
| 4,698,530 | 10/1987 | Thomson | 327/353 |
| 5,099,138 | 3/1992 | Fukunaga | 327/109 |

FOREIGN PATENT DOCUMENTS 3 52010  3/1991  Japan .

Primary Examiner—Albert W. Paladini
Attorney, Agent, or Firm—Leydig, Voit & Mayer

[57] ABSTRACT

A power switching circuit solves a problem associated with conventional power switching circuits. It has been difficult to achieve positive power switching for the operation of low threshold transistors using a voltage below the forward voltage drop of a diode. The difficulty arose because the P-channel transistors on the unselected side of the power switching circuit could not be cut off completely. A power switching circuit according to the present invention includes a power switching portion and a level shifter. The power switching portion includes a first series circuit of two P-channel transistors connected in series across a first input terminal and an output terminal. A second series circuit of two P-channel transistors connected in series is connected across a second input terminal and the output terminal. A level shifter brings the first series circuit into conduction and takes the second series circuit out of conduction in response to the control signal.

6 Claims, 2 Drawing Sheets

POWER SWITCHING CIRCUIT

BACKGROUND OF THE INVENTION

1. Field of the Invention

The present invention relates to a power switching circuit for selecting one of a plurality of supply voltages, and providing the selected supply voltage to internal portions of an IC circuit, and more particularly to a power switching circuit for a CMOS circuit operable at a low supply voltage.

2. Description of Related Art

FIG. 2 is a circuit diagram showing a conventional power switching circuit. In this figure, the reference numerals 101–103 each designate an input terminal of a supply voltage VCC (e.g., a normal supply voltage of 5 V), 104 and 105 each designate an input terminal of a supply voltage VSH different from the supply voltage VCC, 106 designates an output terminal of the selected voltage, 107 designates an input terminal of a control signal having a logical value of "1" or "0", 108 designates a power switching portion and 109 designate a level shifter.

The power switching portion 108 comprises a P-channel transistor 121 connected across the input terminal 101 and the output terminal 106, and a P-channel transistor 122 connected across the input terminal 104 and the output terminal 106.

The level shifter 109 comprises a series connection of a diode 123, a P-channel transistor 124 and an N-channel transistor 125 connected across the input terminal 102 and a ground, another series connection of a diode 126, a P-channel transistor 127 and an N-channel transistor 128 connected across the input terminal 105 and a ground, and an inverter 129 connected between the input terminal 107 and the gate of the N-channel transistor 128. The cathodes of the diodes 123 and 126 are connected to the sources of the P-channel transistors 124 and 127, respectively. The gate of the P-channel transistor 124 is connected to the source of the N-channel transistor 128, and the gate of the P-channel transistor 127 is connected to the source of the N-channel transistor 125.

The reference numerals 130 and 131 designate backgates of the P-channel transistors 121 and 122, respectively, which are set in the floating state. The reference numeral 132 designates a node (connecting point) interconnecting the sources of the P-channel transistors 124 and 127, 133 designates a node interconnecting the drain of the P-channel transistor 124 and the source of the N-channel transistor 125, and 134 designates a node interconnecting the drain of the P-channel transistor 127 and the N-channel transistor 128.

Next, the operation will be described.

First a case will be described where VCC>VSH, and the control signal is set at logic "1" to select the supply voltage VCC. In this case, the N-channel transistor 125 is brought into conduction, while the N-channel transistor 128 is brought out of conduction by the output of the inverter 129. The potential of the node 133 thus set at the ground level is supplied to the gates of the P-channel transistors 121 and 127, and causes them to conduct.

Thus, the potential of the node 134 is set at the potential of the node 132 through the conducting P-channel transistor 127. Since the node 132 is connected through the diodes 123 and 126 to the input terminals 102 and 105, to which the supply voltages VCC and VSH are applied, respectively, no current flows toward the input terminals 102 and 105, and the higher voltage VCC cuts off the diode 126, thereby supplying the node 134 with the higher voltage VCC.

More precisely, the potential of the node 134 becomes (VCC-ΔVd), a value obtained by subtracting from the supply voltage VCC the forward drop voltage ΔVd of the diode 123, which is about 0.5 V, because the diodes 123 and 126 drop their cathode voltages due to the effect of the forward voltage. Thus, the P-channel transistor 122 and the P-channel transistor 124 are brought out of conduction, and the P-channel transistor 121 is brought into conduction, resulting in the output of the supply voltage VCC which is applied to the input terminal 101 from the output terminal 106.

Although the foregoing illustrates the case where VCC>VSH, a similar description holds true when VCC<VSH.

FIG. 3 is a cross-sectional view of the P-channel transistors 121 and 122. When the P-channel transistor 121 is conducting, the potential VCC is conducted from an N-well 141 to an N-well 142 through a wire 136 because the backgates 130 and 131 are placed in the floating state. Accordingly, the potential of the N-well 142 becomes VCC if VCC>VSH, whereas it is maintained at VSH if VCC<VSH. On the other hand, when the P-channel transistor 122 is conducting, the potential VSH is conducted from the N-well 142 to the N-well 141 through the wire 136. Thus, although the potential of the N-well 141 is maintained at VCC, if VCC>VSH, it becomes VSH if VCC<VSH.

When the potential of the source (P-region) becomes higher than that of the N-well in an ordinary P-channel transistor in which the backgate is connected to a power supply, a current will flow from the P-region to the N-well due to the forward voltage across the PN junction. In view of this, it is preferable in the P-channel transistor that the potential of the backgates determining the potential of the N-well be set equal to the potential of the source. The power switching portion 108 as shown in FIG. 1, however, is supplied with two voltages of different potentials, and hence the potential of the output terminal 106 varies depending on whether the VCC or VSH is selected.

When selecting the supply voltage VCC, the P-region at the output terminal 106 side becomes the source of the P-channel transistor 122 if VCC>VSH, whereas the P-region at the input terminal 104 side becomes the source of the P-channel transistor 122 if VCC<VSH, so that setting the backgates 130 and 131 in a floating state makes it possible to handle either case.

Since the conventional power switching circuit is configured as described above, the potential of the level shifter 109, which supplies the gate potential to the unselected P-channel transistor of the two P-channel transistors 121 and 122, becomes lower than the potential of the higher one of the supply voltages VCC and VSH by an amount equal to the forward drop voltage of the diodes 123 and 126.

To cut off the P-channel transistors 121 and 122 completely, their threshold voltage must be set higher than the forward drop voltage of the diodes 123 and 126 because they are thoroughly cut off only when their source-to-gate voltage is lower than the threshold voltage.

If the threshold voltage of the P-channel transistors 121 and 122 constituting the power switching circuit is set lower than the forward voltage drop of the diodes 123 and 126, the unselected P-channel transistor cannot be cut off completely. As a result, a current flows from the higher to the lower one of the two supply voltages VCC and VSH. This presents a problem in that the supply voltage output from the power switching circuit becomes lower than the higher supply voltage when it is selected, or becomes higher than the lower supply voltage when it is selected.

SUMMARY OF THE INVENTION

The present invention is implemented to solve the foregoing problem. It is therefore an object of the present invention to provide a power switching circuit which can positively switch between the supply voltages with suppressing the leakage current across the supply voltages of different potentials even if the transistors with a low threshold voltage are employed to carry out the low voltage operation.

According to an aspect of the present invention, there is provided a power switching circuit comprising a power switching portion and a level shifter, said power switching portion comprising: a first input terminal to which a first supply voltage is applied; a second input terminal to which a second supply voltage is applied which differs from the first supply voltage; an output terminal; a first series circuit connected across the first input terminal and the output terminal, the first series circuit including a series connection of two P-channel transistors; and a second series circuit connected across the second input terminal and the output terminal, the second series circuit including a series connection of two P-channel transistors, and said level shifter comprising: an inverter for bringing, in response to a control signal, a first P-channel transistor of one of the first and second series circuits into conduction, and a first P-channel transistor of the other of the first and second series circuits out of conduction, wherein the level shifter brings, in response to the control signal, a second P-channel transistor of the one of the first and second series circuits into conduction and a second P-channel transistor in the other of the first and second series circuits out of conduction.

Here, the level shifter may comprise: a third input terminal to which a third supply voltage is applied; a fourth input terminal to which a fourth supply voltage is applied; a third series circuit connected across the third input terminal and a ground, the third series circuit including a series connection of a P-channel transistor and an N-channel transistor, and bringing, in response to the control signal, the second P-channel transistor of the one of the first and second series circuits into conduction; and a fourth series circuit connected across the fourth input terminal and a ground, the fourth series circuit including a series connection of a P-channel transistor and an N-channel transistor, and bringing, in response to an inverted signal of the control signal, the second P-channel transistor of the other of the first and second series circuits out of conduction.

The third supply voltage and the fourth voltage may equal the second supply voltage.

The P-channel transistors of the power switching portion may be replaced with N-channel transistors.

DETAILED DESCRIPTION OF THE PREFERRED EMBODIMENTS

The invention will now be described with reference to the accompanying drawings.

EMBODIMENT 1

Figure 1:
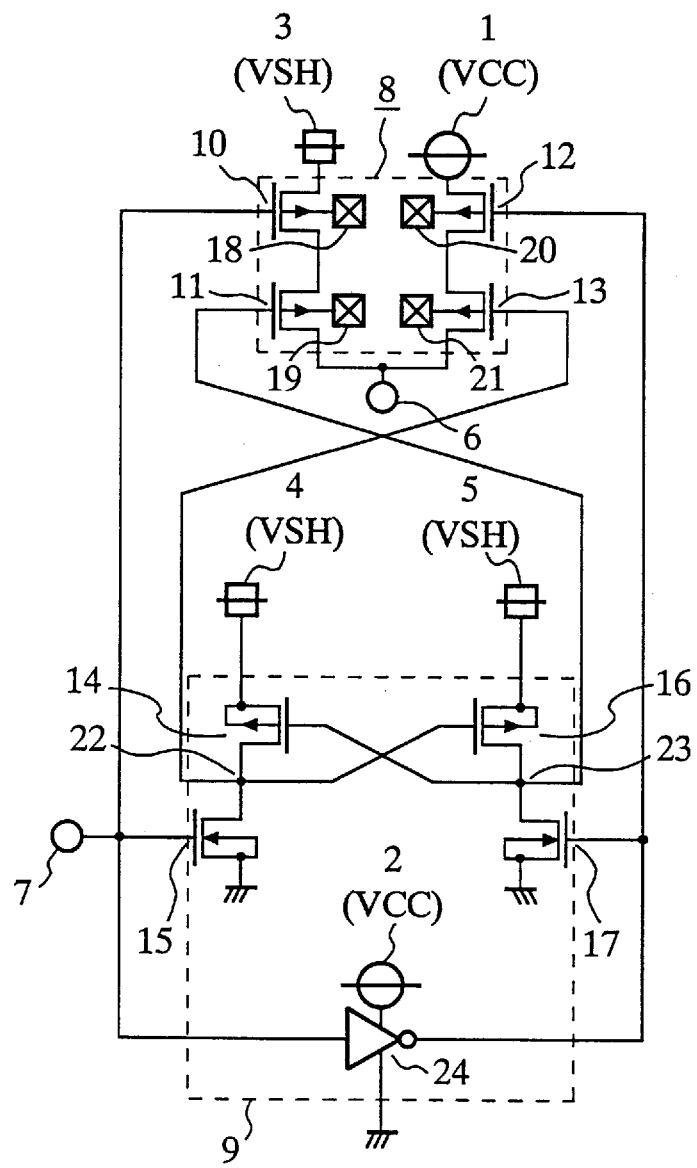
FIG. 1 is a circuit diagram showing embodiment 1 of the power switching circuit in accordance with the present invention.

FIG. 1 is a circuit diagram showing embodiment 1 of the power switching circuit in accordance with the present invention. In this figure, the reference numerals 1 and 2 each designate an input terminal of a supply voltage VCC (e.g., a normal supply voltage of 5 V), 3–5 each designate an input terminal of a supply voltage VSH different from the supply voltage VCC, 6 designates an output terminal of the selected voltage, 7 designates an input terminal of a control signal with a logical value of "1" or "0", 8 designates a power switching portion and 9 designate a level shifter.

The power switching portion 8 comprises a series connection of P-channel transistors 10 and 11 connected across the input terminal 3 and the output terminal 6, and a series connection of P-channel transistors 12 and 13 connected across the input terminal 1 and the output terminal 6.

The level shifter 9 comprises a series connection of a P-channel transistor 14 and an N-channel transistor 15 connected across the input terminal 4 and a ground, another series connection of a P-channel transistor 16 and an N-channel transistor 17 connected across the input terminal 5 and the ground, and an inverter 24 connected between the input terminal 7 and the gate of the N-channel transistor 17. The gate of the P-channel transistor 14 is connected to the source of the N-channel transistor 17, and the gate of the P-channel transistor 16 is connected to the source of the N-channel transistor 15.

The reference numerals 18–21 designate backgates of the P-channel transistors 10–13, respectively, which are set in the floating state. The reference numeral 22 designates a node interconnecting the drain of the P-channel transistor 14 and the source of the N-channel transistor 15, 23 designates a node interconnecting the drain of the P-channel transistor 16 and the source of the N-channel transistor 17.

Next, the operation will be described.

First a case will be described where VCC>VSH, and the control signal is set at logic "1" to select the supply voltage VCC. In this case, the P-channel transistor 10 is brought out of conduction, while the N-channel transistor 15 is brought into conduction. The P-channel transistor 12 is brought into conduction and the N-channel transistor 17 is brought out of conduction in response to the output signal of the inverter 24. As a result, the potential of the node 22 is set at the ground level and supplied to the gates of the P-channel transistors 13 16, causing them to conduct.

When the P-channel transistor 16 conducts, the node 23 is set at the potential VSH applied to the input terminal 5. The potential VSH is then supplied to the gates of the P-channel transistors 11 and 14, and brings them out of conduction. As a result, the P-channel transistors 10 and 11 are brought out of conduction, whereas the P-channel transistors 12 and 13 are brought into conduction, resulting in the output from the output terminal 6 of the supply voltage VCC which is applied to the input terminal 1.

Although the foregoing illustrates the case where VCC>VSH, a similar description holds true when VCC<VSH.

Figure 2:
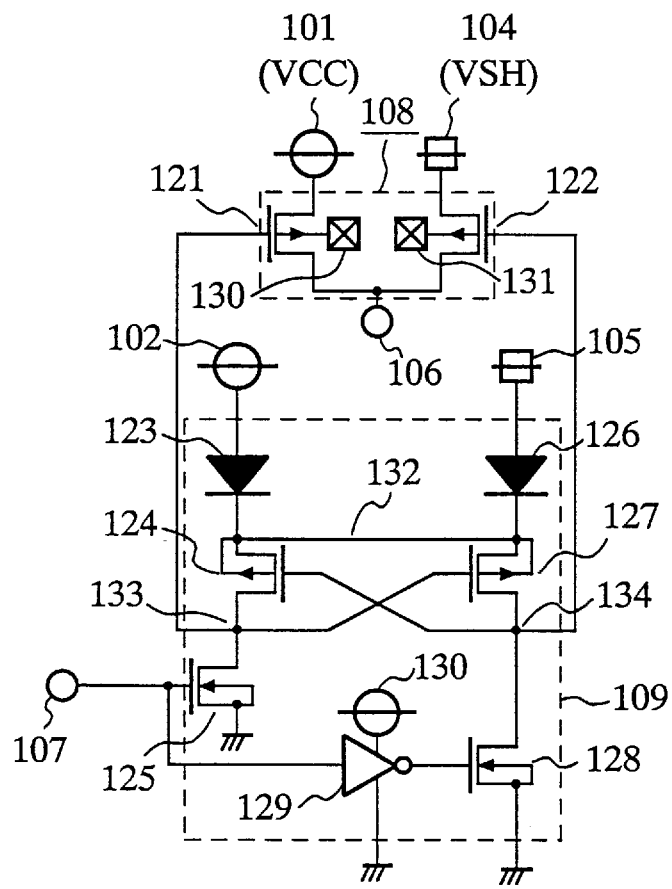
FIG. 2 is a circuit diagram showing a conventional power switching circuit.
Figure 3:
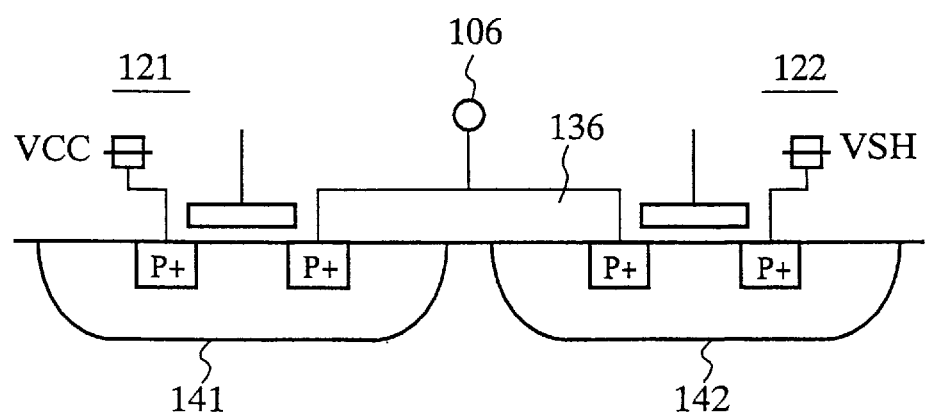
FIG. 3 is a cross-sectional view of P-channel transistors constituting the conventional power switching circuit.

The backgates 18–21 of the P-channel transistors 10–13 constituting the power switching portion 8 are set in the floating state because of the same reason as that of the conventional circuit as shown in FIG. 2. Thus, the potential at the output terminal 6 changes depending on whether the supply voltage VCC or VSH is selected. When selecting the supply voltage VCC, the P-region at the output terminal 6 side becomes the source of the P-channel transistor 10 if VCC>VSH, whereas the P-region at the input terminal 3 side becomes the source of the P-channel transistor 10 if VCC<VSH, so that setting the backgates 18–21 at the floating state makes it possible to handle either case.

The two P-channel transistors connected in series at the unselected side, that is, the P-channel transistors 10 and 11 when the control signal is logic "1", and the P-channel transistors 12 and 13 when the control signal is logic "0", are supplied with the supply voltages VCC and VSH, respectively. This enables at least one of the two P-channel transistors to be completely cut off even if either of the supply voltage VCC or VSH is higher than the other.

As described above, according to embodiment 1, a power switching circuit can be implemented which can suppress the leakage between the different supply voltages VCC and VSH regardless of the forward drop voltage of the diodes and the threshold voltage of the transistors.

EMBODIMENT 2

Although the power switching portion 8 is arranged using the P-channel transistors 10–13 in the embodiment 1, it can be configured using N-channel transistors by replacing the P-channel transistors 14 and 16 constituting the level shifter 9 with N-channel transistors, and the N-channel transistors 15 and 17 with P-channel transistors.

What is claimed is:

1. A power switching circuit comprising:
a power switching portion and a level shifter, the power switching portion comprising
a first input terminal to which a first supply voltage is applied;
a second input terminal to which a second supply voltage is applied, the second supply voltage being different from the first supply voltage;
an output terminal;
a first series circuit connected across the first input terminal and the output terminal, the first series circuit including first and second P-channel transistors connected in series; and
a second series circuit connected across the second input terminal and the output terminal, the second series circuit including third and fourth P-channel transistors connected in series, and
the level shifter comprising
a control signal input terminal for receiving a control signal;
an inverter coupled to the control signal input terminal for bringing one of the first and third P-channel transistors into conduction and another of the first and third P-channel transistors out of conduction, in response to the control signal, and
third and fourth series circuits respectively coupled to the second and fourth P-channel transistors for bringing one of the second and fourth P-channel transistors into conduction, in response to the control signal, and another of the second and fourth P-channel transistors out of conduction in response to an inverted control signal.

2. The power switching circuit as claimed in claim 1, wherein the level shifter comprises:
a third input terminal to which a third supply voltage is applied;
a fourth input terminal to which a fourth supply voltage is applied, wherein
the third series circuit is connected across the third input terminal and ground, and the third series circuit includes a fifth P-channel transistor and a first N-channel transistor, connected in series, for bringing one of the second and fourth P-channel transistors into conduction in response to the control signal; and
the fourth series circuit is connected across the fourth input terminal and ground, and the fourth series circuit includes a sixth P-channel transistor and a second N-channel transistor, connected in series, for bringing one of the second and fourth P-channel transistors out of conduction, in response to the inverted control signal.

3. The power switching circuit as claimed in claim 2, wherein the third supply voltage and the fourth voltage are equal to the second supply voltage.

4. A power switching circuit comprising:
a power switching portion and a level shifter, the power switching portion comprising
a first input terminal to which a first supply voltage is applied;
a second input terminal to which a second supply voltage is applied, the second supply voltage being different from the first supply voltage;
an output terminal;
a first series circuit connected across the first input terminal and the output terminal, the first series circuit including first and second N-channel transistors connected in series; and
a second series circuit connected across the second input terminal and the output terminal, the second series circuit including third and fourth N-channel transistors connected in series,
the level shifter comprising
a control signal input terminal for receiving a control signal;
an inverter for bringing one of the first and third N-channel transistors into conduction, and another of the first and third N-channel transistors out of conduction, in response to the control signal, and
third and fourth series circuits respectively coupled to the second and fourth N-channel transistors for bringing one of the second and fourth N-channel transistors series circuits into conduction, in response to the control signal, and another of the second and fourth N-channel transistors out of conduction, in response to an inverted control signal.

5. The power switching circuit as claimed in claim 4, wherein the level shifter comprises:
a third input terminal to which a third supply voltage is applied;
a fourth input terminal to which a fourth supply voltage is applied, wherein
the third series circuit is connected across the third input terminal and ground, and the third series circuit includes a fifth N-channel transistor and a first P-channel transistor, connected in series, for bringing one of the second and fourth N-channel transistors into conduction, in response to the control signal; and
the fourth series circuit is connected across the fourth input terminal and ground, and the fourth series circuit includes a sixth N-channel transistor and a second P-channel transistor, connected in series, for bringing one of the second and fourth N-channel transistors out of conduction, in response to the inverted control signal.

6. The power switching circuit as claimed in claim 5, wherein the third supply voltage and the fourth voltage are equal to the second supply voltage.

* * * * *